(12) United States Patent
Lee et al.

(10) Patent No.: US 11,469,343 B2
(45) Date of Patent: Oct. 11, 2022

(54) COMPRESSION BONDING APPARATUS

(71) Applicant: SAMSUNG ELECTRONICS CO., LTD., Suwon-si (KR)

(72) Inventors: Yoonsuk Lee, Suwon-si (KR); Doyoung Kwag, Suwon-si (KR); Sangmoo Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 49 days.

(21) Appl. No.: 16/768,492

(22) PCT Filed: Jan. 3, 2019

(86) PCT No.: PCT/KR2019/000089
§ 371 (c)(1),
(2) Date: May 29, 2020

(87) PCT Pub. No.: WO2019/160241
PCT Pub. Date: Aug. 22, 2019

(65) Prior Publication Data
US 2020/0388720 A1    Dec. 10, 2020

(30) Foreign Application Priority Data

Feb. 14, 2018  (KR) .................. 10-2018-0018612

(51) Int. Cl.
*H01L 33/00* (2010.01)
*H01L 33/56* (2010.01)
*H01L 21/683* (2006.01)

(52) U.S. Cl.
CPC .......... *H01L 33/005* (2013.01); *H01L 21/683* (2013.01); *H01L 33/56* (2013.01); *H01L 2933/005* (2013.01)

(58) Field of Classification Search
CPC ................. H01L 33/005; H01L 21/683; H01L 2933/005
See application file for complete search history.

(56) References Cited

U.S. PATENT DOCUMENTS 8,927,305 B2   1/2015  Song et al.
9,956,643 B2   5/2018  Matsubayashi
(Continued)

FOREIGN PATENT DOCUMENTS

JP   2000-183111 A   6/2000
JP   2002-26071 A    1/2002
(Continued)

OTHER PUBLICATIONS

Search Report dated Apr. 11, 2019 (PCT/ISA/210) issued by the International Searching Authority for International Application No. PCT/KR2019/000089.
(Continued)

*Primary Examiner* — Jay C Chang
*Assistant Examiner* — Mikka Liu
(74) *Attorney, Agent, or Firm* — Sughrue Mion, PLLC

(57) ABSTRACT

A compression bonding apparatus is disclosed. The compression bonding apparatus comprises: a stage configured to support a substrate on which a plurality of light emitting elements are arranged on an adhesive layer having a predetermined viscosity; a support member disposed on the stage and surrounding at least a part of a side surface of the substrate; and a pressing member configured to press the plurality of light emitting elements, wherein the support member is configured to have a height equal to or greater than the height of the substrate.

16 Claims, 13 Drawing Sheets

(56) References Cited

U.S. PATENT DOCUMENTS

| | | |
|---|---|---|
| 2009/0009046 A1 | 1/2009 | Oh et al. |
| 2013/0029439 A1* | 1/2013 | Song ................... H01L 33/52 |
| | | 438/27 |
| 2013/0056686 A1* | 3/2013 | Namiki ................ C08G 59/42 |
| | | 252/500 |
| 2017/0066075 A1* | 3/2017 | Matsubayashi ........ B23K 20/26 |
| 2017/0263824 A1* | 9/2017 | Hashimoto ........... H01L 33/507 |
| 2018/0007798 A1 | 1/2018 | Yamaguchi et al. |

FOREIGN PATENT DOCUMENTS

| | | |
|---|---|---|
| JP | 2003-297879 A | 10/2003 |
| JP | 6129353 B2 | 5/2017 |
| KR | 10-2009-0000314 A | 1/2009 |
| KR | 10-2012-0033864 A | 4/2012 |
| KR | 10-2013-0013468 A | 2/2013 |
| KR | 10-2016-0141179 A | 12/2016 |
| KR | 10-2017-0050538 A | 5/2017 |
| WO | 2016/114206 A1 | 7/2016 |

OTHER PUBLICATIONS

Written Opinion dated Apr. 11, 2019 (PCT/ISA/237) issued by the International Searching Authority for International Application No. PCT/KR2019/000089.

Communication dated Apr. 29, 2022 by the Korean Intellectual Property Office in Korean Patent English Application No. 10-2018-0018612.

* cited by examiner (a)

(b)

←LARGE PRESSURE    SMALL PRESSURE→

COMPRESSION BONDING APPARATUS

TECHNICAL FIELD

The disclosure relates to a compression bonding apparatus having improved precision and a method for manufacturing a light source module using the same.

BACKGROUND ART

Display devices that display images are devices that display images using a display panel and are used in various devices such as a television, a computer monitor, and a smartphone. However, because a general display device does not emit light itself, a backlight unit equipped with a separate light source is required, and the backlight unit is arranged behind a display panel.

The backlight unit may be divided into a direct-lit type in which a light source module that emits light is arranged on a rear of the display panel to directly irradiate light to the display panel, and an edge-lit type in which a light source module irradiates light to a side of a light guide plate arranged on the rear of the display panel and uniformly guides light incident on the light guide plate to the display panel through the light guide plate.

The light source module applied to the display device has a structure in which a plurality of light emitting devices are coupled to a substrate extending along a length direction or a width direction of the display device, in which the plurality of light emitting devices may be constituted by a light emitting diode (LED), a cold cathode fluorescent lamp (CCFL), an external electrode fluorescent lamp (EEFL), a laser diode (LD), or the like.

The conventional light source module is generally manufactured by thermocompression bonding in which a plurality of light emitting devices temporarily attached to an adhesive layer on a substrate are pressed and heated through a compression bonding apparatus.

The compression bonding apparatus includes a stage and a pressing member, and attaches the plurality of light emitting devices to the substrate by pressing and heating the plurality of light emitting devices of the substrate arranged on the stage by the pressing member.

DISCLOSURE

Technical Problem

Recently, an ultra-compact micro LED having a size of micrometer (μm) is applied to the light source module of the display device, and a process of attaching the plurality of micro LEDs to the substrate requires high precision in units of micrometer (μm).

In particular, in the process of manufacturing a light source module that presses and heats a plurality of micro LEDs by a pressing member of a compression bonding device, it is required to prevent disposition and arrangement of the plurality of preset micro LEDs from being deformed.

Technical Solution

The disclosure provides a compression bonding apparatus for precisely attaching a plurality of light emitting devices to a substrate, and a method for manufacturing a light source module using the same.

According to an aspect of the present disclosure, a compression bonding apparatus includes: a stage configured to support a substrate on which a plurality of light emitting devices are arranged on an adhesive layer having a predetermined viscosity; a support member disposed on the stage and surrounding at least a part of a side surface of the substrate; and a pressing member configured to press the plurality of light emitting devices, in which the support member is configured to have a height equal to or greater than a height of the substrate.

The pressing member may descend from upper sides of the plurality of light emitting devices to press the plurality of light emitting devices so that the plurality of light emitting devices come into contact with the substrate.

The height of the support member may be set to be equal to a sum of the height of the substrate and a height of the light emitting device.

The height of the support member may beset to be smaller than a sum of the height of the substrate, a height of the adhesive layer, and the height of the light emitting device.

The height of the support member may be set to be equal to or greater than the sum of the height of the substrate and the height of the light emitting device.

A height of a part of the support member may be set to be different from heights of other parts thereof.

The support member may surround the entire side surface portion of the substrate along a circumference of the substrate.

The substrate may have a rectangular shape, the side surface portion of the substrate may include first to fourth side surfaces, and the support member may be configured in plural and include first to fourth support members each surrounding the first to fourth side surfaces.

A height of at least one of the first to fourth support members may be set differently.

An upper surface of the support member and each upper surface of the plurality of light emitting devices may be arranged in parallel with a pressed surface of the pressing member.

At least a part of the upper surface of the support member may face the pressed surface of the pressing member.

The adhesive layer may be made of a thermosetting material, and the pressing member may heat the adhesive layer while pressing the plurality of light emitting devices.

Thermal conductivity of the support member may be equal to that of the substrate.

According to an aspect of the present disclosure, a method of manufacturing a light source module includes: forming an adhesive layer having a predetermined viscosity on an upper surface of a substrate; arranging a plurality of light emitting devices on the adhesive layer, arranging the substrate on which the plurality of light emitting devices on a stage; arranging a support member surrounding at least a part of the substrate and configured to have a height equal to or greater than a height of the substrate on the stage; and pressing the plurality of light emitting devices by a pressing member descending from upper sides of the plurality of light emitting devices.

According to an aspect of the present disclosure, a method of manufacturing a light source module includes: measuring a pressure distribution applied by a pressing member to a stage by pressing a pressure sensing sheet arranged on the stage by a pressing member, arranging a substrate on which a plurality of light emitting devices are arranged on an adhesive layer having a predetermined viscosity; arranging a support member surrounding at least a part of the substrate and configured to have a height equal to or greater than a height of the substrate on the stage; and pressing the plurality of light emitting devices by the pressing member descending from upper sides of the plurality of light emitting devices, in which the support member is configured so that a height of a part corresponding to a part where the pressure distribution is measured relatively higher is greater than heights of other parts corresponding to a part where the pressure distribution is measured relatively lower.

BEST MODE

To sufficiently understood configurations and effects of the disclosure, embodiments of the disclosure will be described with reference to the accompanying drawings. However, the disclosure is not limited to embodiments to be described below, but may be implemented in several forms and may be variously modified. A description for these embodiments will be provided only to make the disclosure complete and allow those skilled in the art to which the disclosure pertains to completely recognize the scope of the disclosure. In the accompanying drawings, sizes of components may be enlarged as compared with actual sizes for convenience of explanation, and ratios of the respective components may be exaggerated or reduced.

It is to be understood that when one component is referred to as being "connected to" or "coupled to" another component, it may be connected directly to or coupled directly to another component or be connected to or coupled to another component with the other component interposed therebetween. On the other hand, when a component is described as being "directly on" or "in direct contact with" another component, it can be understood that other components are not present therebetween. Other expressions describing the relationship between the components, for example, "between", "directly between", and the like can be interpreted similarly.

Terms used in the specification, 'first', 'second', etc., may be used to describe various components, but the components are not to be interpreted to be limited to the terms. These terms may be used to differentiate one component from other components. For example, a 'first' component may be named a 'second' component and the 'second' component may also be similarly named the 'first' component, without departing from the scope of the disclosure.

Singular forms are intended to include plural forms unless the context clearly indicates otherwise. It may be interpreted that terms "include". "have", or the like, means the presence of features, numerals, steps, operations, components, parts mentioned in the present specification, or a combination thereof, but do not preclude the addition of one or more other features, numerals, steps, operations, components, parts, or a combination thereof.

Terms used in embodiments of the disclosure may be interpreted as the same meanings as meanings that are generally known to those skilled in the art unless defined otherwise.

Figure 1:
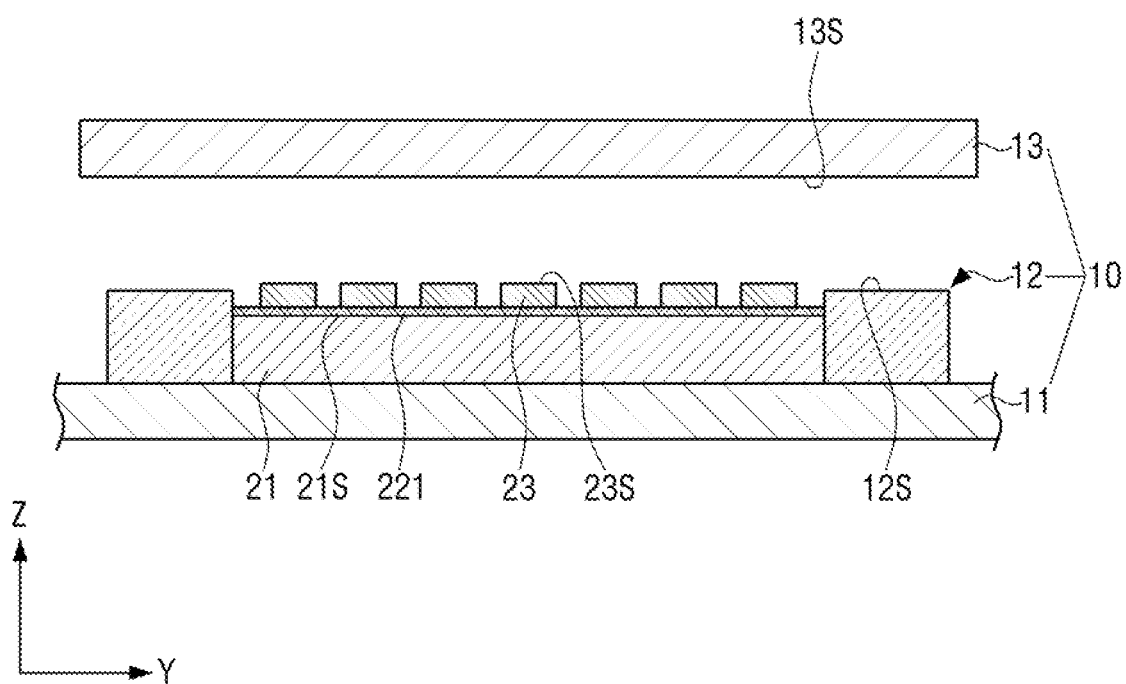
FIG. 1 is a cross-sectional view schematically illustrating a compression bonding apparatus according to an embodiment of the disclosure.
Figure 2:
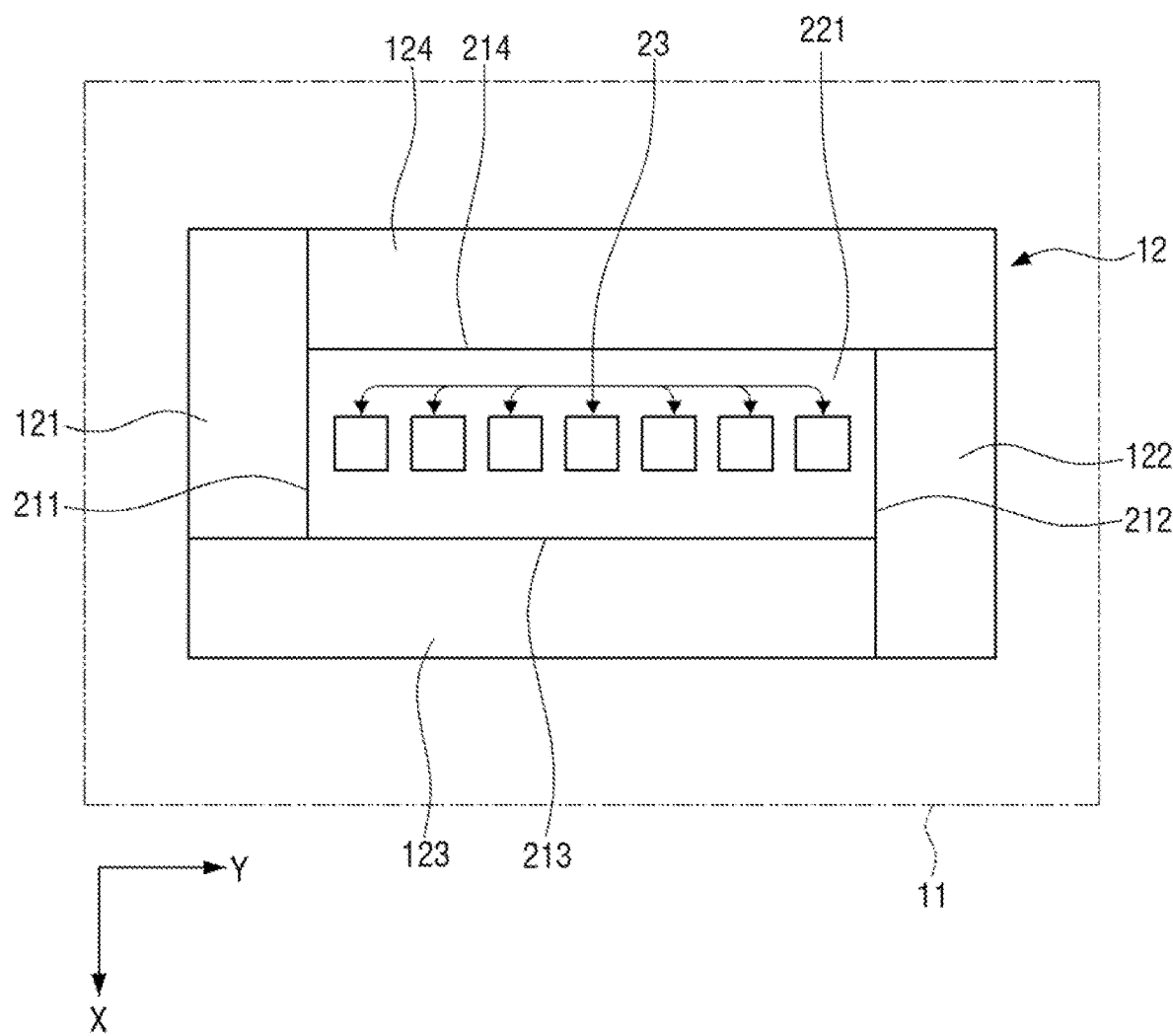
FIG. 2 is a plan view illustrating a substrate arranged on a stage of the compression bonding apparatus illustrated in FIG. 1.

FIG. 1 is a cross-sectional view schematically illustrating a compression bonding apparatus 10 according to an embodiment of the disclosure, and FIG. 2 is a plan view illustrating a substrate 21 arranged on the stage 11 of the compression bonding apparatus 10 illustrated in FIG. 1.

An example is described in which the compression bonding apparatus 10 described below presses a plurality of light emitting devices 23 temporarily attached to an adhesive layer 221 of the substrate 21 to couple the plurality of light emitting devices 23 to the substrate 21, but the compression bonding apparatus 10 may be an apparatus that presses various types of components in addition to the plurality of light emitting devices 23 and bonds the components to the substrate.

Referring to FIGS. 1 and 2, the compression bonding apparatus 10 includes a stage 11, a support member 12, and a pressing member 13.

The stage 11 supports a substrate 21 on which the plurality of light emitting devices 23 are arranged on an adhesive layer 221 having a predetermined viscosity.

The stage 11 may be constituted by a surface plate, and preferably has a shape and size capable of supporting the substrates 21 having various shapes and sizes.

The substrate 21 is arranged on the stage 11 while the plurality of light emitting devices 23 are temporarily attached on the adhesive layer 221.

The substrate 21 may have a shape extending along a length direction or a width direction of the display device to which the substrate 21 is applied, and the plurality of light emitting devices 23 are arranged at regular intervals along the length direction of the substrate 21.

The plurality of light emitting devices 23 may be configured to include a light emitting diode (LED), a cold cathode fluorescent lamp (CCFL), an external electrode fluorescent lamp (EEFL), a laser diode (LD), or the like.

In addition, the plurality of light emitting devices 23 may be constituted by an ultra-compact micro LED having a height of 5 to 10 micrometers (μm).

The substrate 21 may be constituted by a printed circuit board, or a thin film transistor (TFT) substrate.

The adhesive layer 221 may be made of an adhesive material covering an upper surface 21S of the substrate 21.

In addition, the adhesive layer 221 may be made of a resin material having a predetermined viscosity.

As a result, the plurality of light emitting devices 23 arranged on the adhesive layer 221 are pressed by the pressing member 13 to be described later, so the plurality of light emitting devices 23 pass through the adhesive layer 221 and come into contact with the substrate 21.

The adhesive layer 221 may be made of a non-conductive paste (NCP) or an anisotropic conductive paste (ACP) coupled to the upper surface 21S of the substrate 21.

In addition, the adhesive layer 221 may be made of a non-conductive adhesive or anisotropic conductive adhesive applied to the upper surface 21S of the substrate 21, and may be constituted by a non-conductive film, an anisotropic conductive film, or the like attached to the upper surface 21S of the substrate 21.

In addition, the adhesive layer 221 may be made of a thermosetting material. Thereby, the adhesive layer 221 is cured by heat while the plurality of light emitting devices 23 are in contact with the substrate 21, so the plurality of light emitting devices 23 can be fixed to the substrate 21.

The pressing member 13 is movably arranged up and down from the upper side of the stage 11, and can be pressed against the plurality of light emitting devices 23 by descending toward the plurality of light emitting devices 23.

The pressing member 13 may be constituted by the surface plate arranged in parallel with the stage 11.

The pressing member 13 descends, and thus a pressed surface 13S of the pressing member 13 comes into contact with upper surfaces 23S of the plurality of light emitting devices 23, and the pressing member 13 further descends in this state to press the plurality of light emitting devices 23.

It is preferable that the pressed surface 13S and the upper surfaces 23S of the plurality of light emitting devices 23 are arranged in parallel so that the pressing member 13 can simultaneously press the plurality of light emitting devices 23.

Further, it is preferable that the pressing member 13 descends while the pressed surface 13S keeps parallel with the upper surfaces 23S of the plurality of light emitting devices 23 to press the upper surface 23S of the plurality of light emitting devices 23 simultaneously, and as a result, the pressing member 13 can compress the plurality of light emitting devices 23 against the substrate 21 while the plurality of light emitting devices 23 are kept at a predetermined position.

In addition, the size of the pressed surface 13S of the pressing member 13 is preferably configured to be larger than an upper surface 12S of the substrate 21.

The pressing member 13 descends toward the plurality of light emitting devices 23 and presses the plurality of light emitting devices 23 arranged on the adhesive layer 221 having a predetermined viscosity, so the plurality of light emitting devices 23 may come into contact with the substrate 21.

In addition, the pressing member 13 may include a separate heater (not illustrated) capable of heating the adhesive layer 221 in the process of pressing the plurality of light emitting devices 23.

Thereby, the adhesive layer 221 may be cured by heating the adhesive layer 221 made of a thermosetting material while the pressing member 13 presses the plurality of light emitting devices 23.

For example, the pressing member 13 may be heated to a temperature of 250° C. to 300° C. to heat the adhesive layer 221, and the adhesive layer 221 may be made of a thermosetting material that is cured at a temperature of 250° C. to 300° C.

The support member 12 is arranged on the stage 11 and surrounds at least a part of a side surface portion of the substrate 21.

The support member 12 may be configured to have a height equal to or greater than the height of the substrate 21.

The support member 12 is arranged so that at least a part of the upper surface 12S of the support member 12 faces the pressed surface 13S of the pressing member 13 described later.

Thereby, the support member 12 may support the pressing member 13 while the pressing member descends to press the plurality of light emitting devices 23.

As illustrated in FIG. 2, the support member 12 may have a structure surrounding the entire side surface portion of the substrate 21 along the circumference of the substrate 21, and also have a structure surrounding a part of the side surface portion of the substrate 21.

As a specific example, as illustrated in FIGS. 1 and 2, the substrate 21 may have a rectangular shape extending in a horizontal direction, and the side surface portion of the substrate 21 may include first to fourth side surfaces 211 to 214.

The substrate 21 may have a substantially rectangular shape, and a first side surface 211 and a second side surface 212 of the substrate 21 may be parallel to each other, and a third side surface 213 and a fourth side surface 214 thereof may be arranged parallel to each other.

In addition, the support member 12 may be provided in plural, and may include first to fourth support members 121 to 124 surrounding the first to fourth side surfaces 211 to 214 of the substrate 21, respectively.

The first to fourth support members 121 to 124 may have a rectangular rod shape surrounding the first to fourth side surfaces 211 to 214 of the substrate 21, respectively, and the first to fourth support members 121 to 124 may have a structure surrounding the entire side surface portions 211 to 214 of the substrate 21.

However, the first to fourth support members 121 to 124 illustrated in FIG. 2 are exemplary structures, and the support member 12 according to an embodiment of the disclosure may have a structure in which the first to fourth support members 121 to 124 are integrally formed. In addition, the support member 12 may have a structure formed of at least one of the first to fourth support members 121 to 124, and may have a structure surrounding a part of the side surface portions of the substrate 12 or a structure surrounding at least one of the first to fourth side surfaces 211 to 214.

In addition, in addition to the structure in which the support member 12 is in contact with the side surface portion of the substrate 21 to surround the side surface portion of the substrate 12, the support member 12 may be disposed close to the side surface portion of the substrate 12 while being spaced apart at a predetermined distance from the side surface portion of the substrate 12.

The support member 12 may be configured to have a height equal to or greater than a height of the substrate 21.

Thereby, the support member 12 may support the pressing member 13 so that the pressing member 13 is kept horizontal while the pressing member 13 descends to press the plurality of light emitting devices 23.

The specific process of compressing the plurality of light emitting devices 23 arranged on the adhesive layer 221 by the compression bonding apparatus 10 to the substrate 21 will be described later.

FIGS. 3 to 6 are diagrams illustrating the process of manufacturing the light source module 20 (see FIG. 6) by the compression bonding apparatus 10 according to an embodiment of the disclosure.

Hereinafter, the process of manufacturing the light source module 20 by compressing the plurality of light emitting devices 23 by the compression bonding apparatus 10 according to the embodiment of the disclosure and attaching the plurality of light emitting devices 23 to the substrate 21 will be described with reference to FIGS. 3 to 6.

Figure 3:
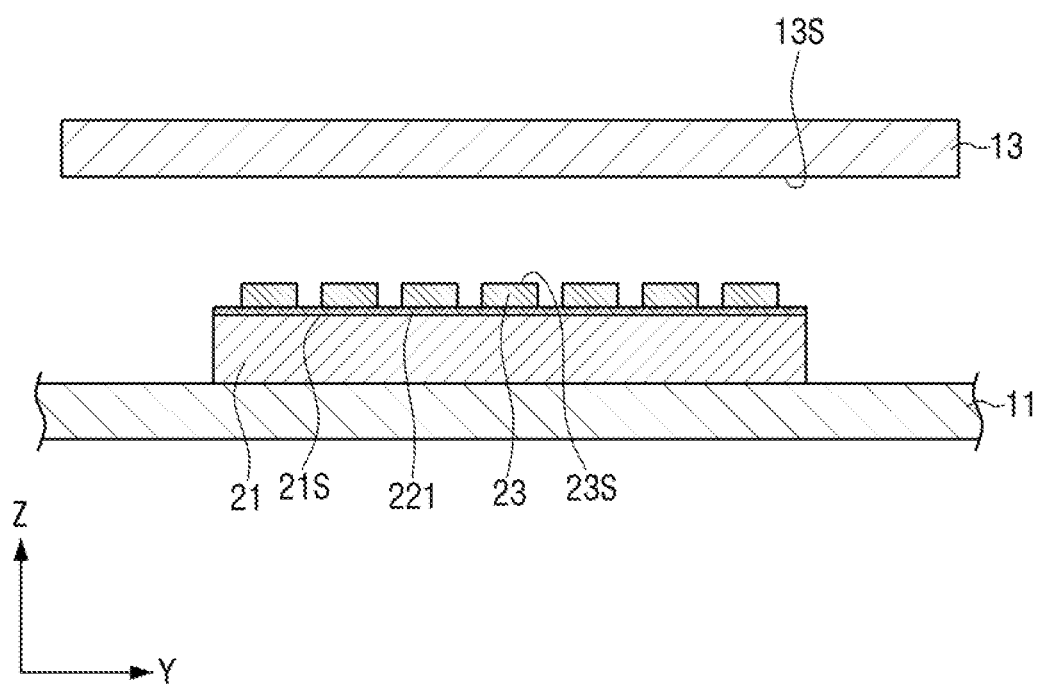
FIGS. 3 to 6 are views illustrating a process of manufacturing a light source module through a compression bonding device according to an embodiment of the disclosure.

First, as illustrated in FIG. 3, the substrate 21 on which the plurality of light emitting devices 23 are arranged on the adhesive layer 221 is arranged on the stage 11.

As described above, the substrate 21 is arranged on the stage 11 while the plurality of light emitting devices 23 are temporarily attached on the adhesive layer 221.

While the plurality of light emitting devices 23 arranged on the adhesive layer 221 are temporarily attached as a predetermined disposition and arrangement on the adhesive layer 221, the substrate 21 is arranged on the stage 11.

The adhesive layer 221 is formed to cover the upper surface 21S of the substrate 21, and the plurality of light emitting devices 23 arranged on the adhesive layer 221 are arranged on the stage 11 in a non-contact state with the substrate 21.

Figure 4:
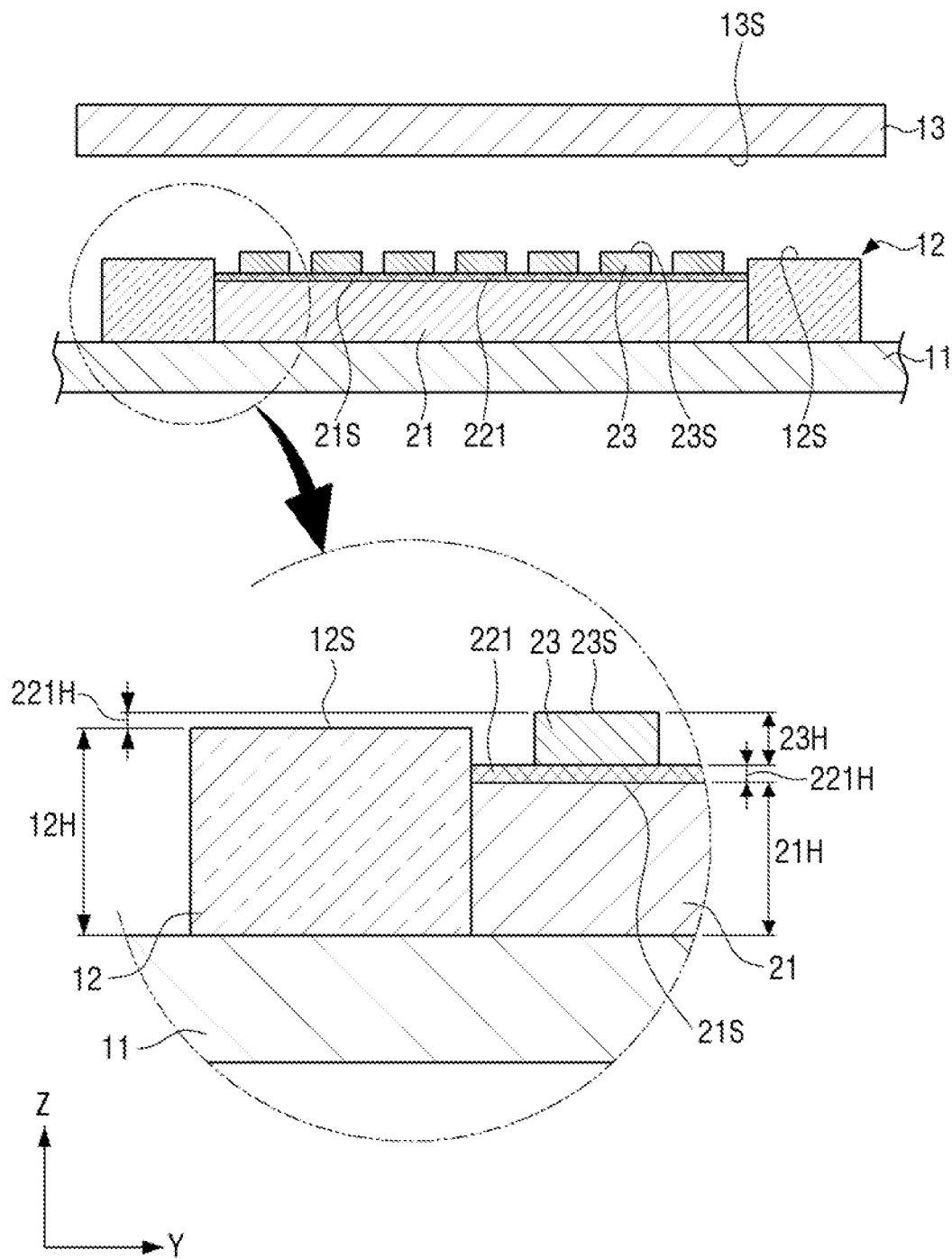
Figure 5:
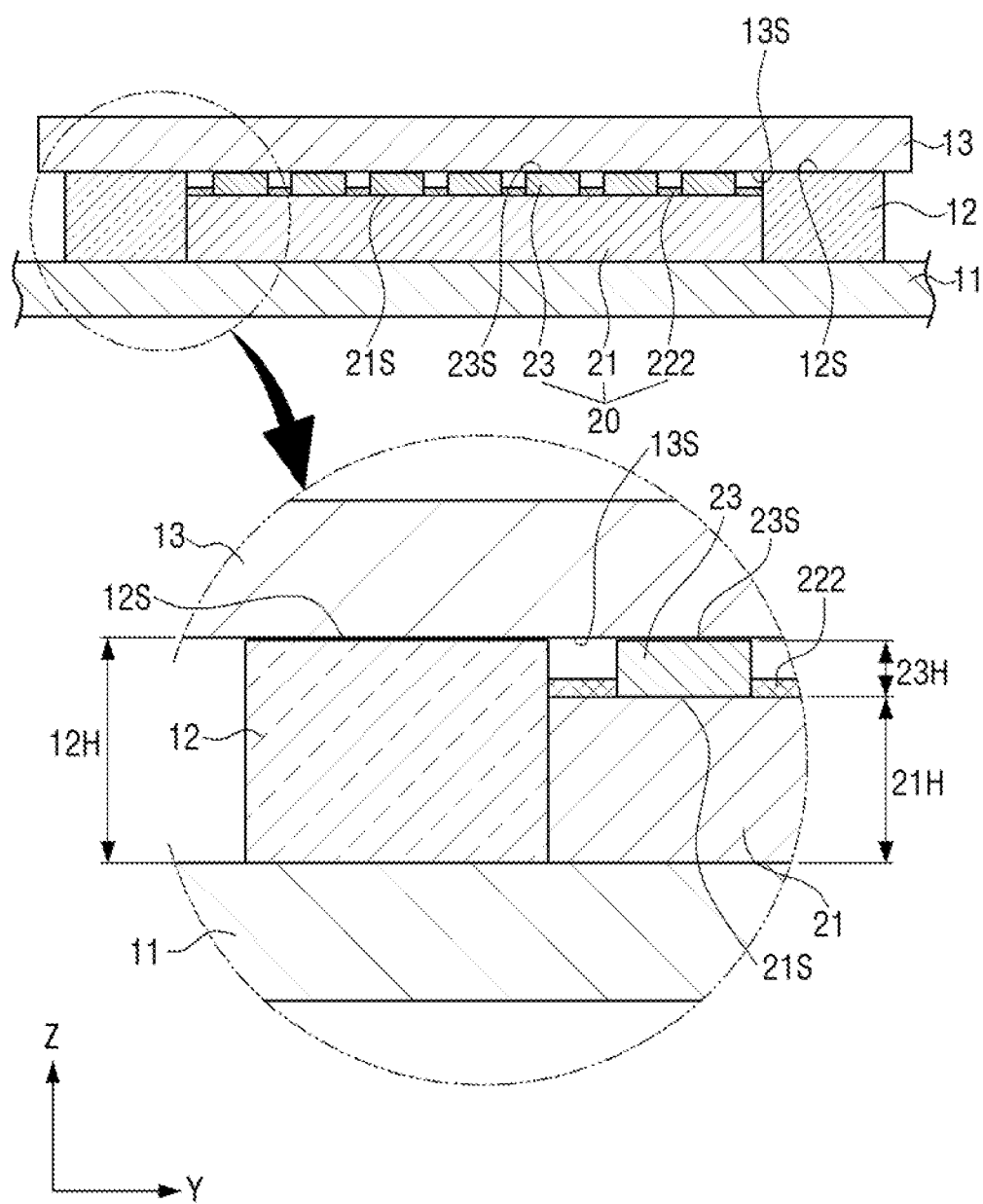

Thereafter, as illustrated in FIGS. 4 and 5, after the support member 12 surrounding at least a part of the side surface portion of the substrate 21 is arranged on the stage 11, the pressing member 13 descends to press the plurality of light emitting devices 23 so that the plurality of light emitting devices 23 come into contact with the substrate 21.

As described above, the support member 12 may have a structure surrounding a part of the side surface portion of the substrate 21 or the entire side surface portion of the substrate 21, and may include the first to fourth support members 121 to 124 that surround the first to fourth side surfaces 211 to 214 of the substrate 21.

Therefore, the substrate 21 on which the plurality of light emitting devices 23 are arranged on the adhesive layer 221 is arranged inside the support member 12.

In addition, the support member 12 may be configured to have a height 12H equal to or greater than a height 21H of the substrate 21, and the upper surface 12S of the support member 12 is arranged to face the pressed surface 13S of the pressing member 13.

Thereby, while the pressing member 13 descends to press the plurality of light emitting devices 23, the support member 12 may support the pressing member 13 to keep the inclined pressing member 13 horizontal even when the pressing member 13 is inclined. Thereby, the pressing member 13 may press the plurality of light emitting devices 23 while the pressed surface 13S is kept parallel with the upper surface 23S of the plurality of light emitting devices 23.

That is, while the pressing member 13 descends to press the plurality of light emitting devices 23, the support member 12 may support the pressing member 13 so that a pressure distribution of the pressing member 13 applied to the plurality of light emitting devices 23 becomes uniform even when the pressing member 13 is inclined or flatness or leveling of the pressing member 13 is distorted.

In addition, in addition to the reason that the pressing member 13 is inclined, even if the pressure distribution for pressing the plurality of light emitting devices 23 is not uniform due to reasons such as shaking while the pressing member 13 descends, the support member 12 may support the pressing member 13 so that the pressure applied to the plurality of light emitting devices 23 becomes uniform.

In addition, the support member 12 is preferably configured to have the height 12H smaller than a sum of the height 21H of the substrate 21, a height 221H of the adhesive layer 221, and the height 23H of the plurality of light emitting devices 23 so that the pressing member 13 comes into contact with the upper surface 23S of the plurality of light emitting devices 23 to press the plurality of light emitting devices 23.

In addition, the pressing member 13 may simultaneously press the plurality of light emitting devices 23 and the support member 12.

As a more specific example, as illustrated in FIGS. 4 and 5, the support member 12 may be configured to have the height 12H equal to the sum of the height 21H of the substrate 21 and the height 23H of the plurality of light emitting devices 23.

Before the pressing member 13 presses the plurality of light emitting devices 23, the upper surfaces 23S of the plurality of light emitting devices 23 are arranged to be closer to the pressed surface 13S than the upper surface 12S of the support member 12.

Before being pressed, the upper surfaces 23S of the plurality of light emitting devices 23 are arranged above the upper surface 12S of the support member 12 by the height 221H of the adhesive layer 221.

The pressing member 13 descends, and thus the pressed surface 13S first contacts the upper surfaces 23S of the plurality of light emitting devices 23 before the upper surface 12S of the support member 12, so the pressing member 13 may press the plurality of light emitting devices 23.

As described above, because the adhesive layer 221 has a predetermined viscosity, the plurality of light emitting devices 23 are pressed by the pressing member 13, and as a result, as illustrated in FIG. 5, may come into contact with the substrate 21 by passing through the adhesive layer 222.

For convenience of description, the adhesive layer 221 before the plurality of light emitting devices 23 illustrated in FIG. 4 are pressed is denoted by reference numeral 221, and the plurality of light emitting devices 23 illustrated in FIG. 5 are pressed, and thus the adhesive layer 222 while the plurality of light emitting devices 23 have passed through the adhesive layer 222 is denoted by reference numeral 222.

The plurality of light emitting devices 23 may descend by the height 221H of the adhesive layer 221 by the pressing of the pressing member 13 to come into contact with the substrate 21.

As described above, the plurality of light emitting devices 23 may be constituted by the micro LEDs.

The pressing member 13 presses the plurality of light emitting devices 23 downward while the pressed surface 13S comes into contact with the upper surfaces 23S of the plurality of light emitting devices 23, and the pressing member 13 may descend by the height 221H of the adhesive layer 221 to come into contact with the upper surface 12S of the support member 12.

The pressing member 13 simultaneously presses the plurality of light emitting devices 23 while the pressed surface 13S of the pressing member 13 comes into contact with the upper surfaces 23S of the plurality of light emitting devices 23, and the pressing member 13 descends by the height 221H of the adhesive layer 221 while coining into contact with the upper surfaces 23S of the plurality of light emitting devices 23, so the plurality of light emitting devices 23 come into contact with the substrate 21 by passing through the adhesive layer 221.

However, the pressing member 13 may be inclined while the pressing member 13 presses the plurality of light emitting devices 23 and descends, and in this case, the pressing member 13 may come into contact with the support member 12 before descending by the height 221H of the adhesive layer 221.

The support member 12 may support a portion inclined downward of the pressing member 13 so that the pressing member 13 is kept horizontal.

Thereby, the pressing member 13 is kept horizontal by the support member 12 even when being inclined while pressing the plurality of light emitting devices 23, thereby applying the uniform pressure to the plurality of light emitting devices 23.

Accordingly, the plurality of light emitting devices 23 may be simultaneously applied with the uniform pressure through the pressing member 13, and as a result, may come into contact with the substrate 21 by passing through the adhesive layer 221 while maintaining the predetermined arrangement.

The plurality of light emitting devices 23 may be electrically connected to a connection pad (not illustrated) of the substrate 21 by coming into contact with the substrate 21 by passing through the adhesive layer 221, so the light source module 20 may be completed.

As described above, the pressing member 13 may include a separate heater, and the adhesive layer 221 may be cured by heating the adhesive layer 221 made of a thermosetting material while the pressing member 13 presses the plurality of light emitting devices 23.

Therefore, while the plurality of light emitting devices 23 come into contact with the substrate 21, the adhesive layer 222 is cured so that the plurality of light emitting devices 23 may be stably fixed.

In addition, the thermal conductivity of the support member 12 may be the same as that of the substrate 21.

Therefore, while the heat of the pressing member 13 is transferred to the adhesive layer 221, the heat of the pressing member 13 may be uniformly transferred to the entire area of the adhesive layer 221 through the support member 12 surrounding the side surface portion of the substrate 21.

Figure 6:
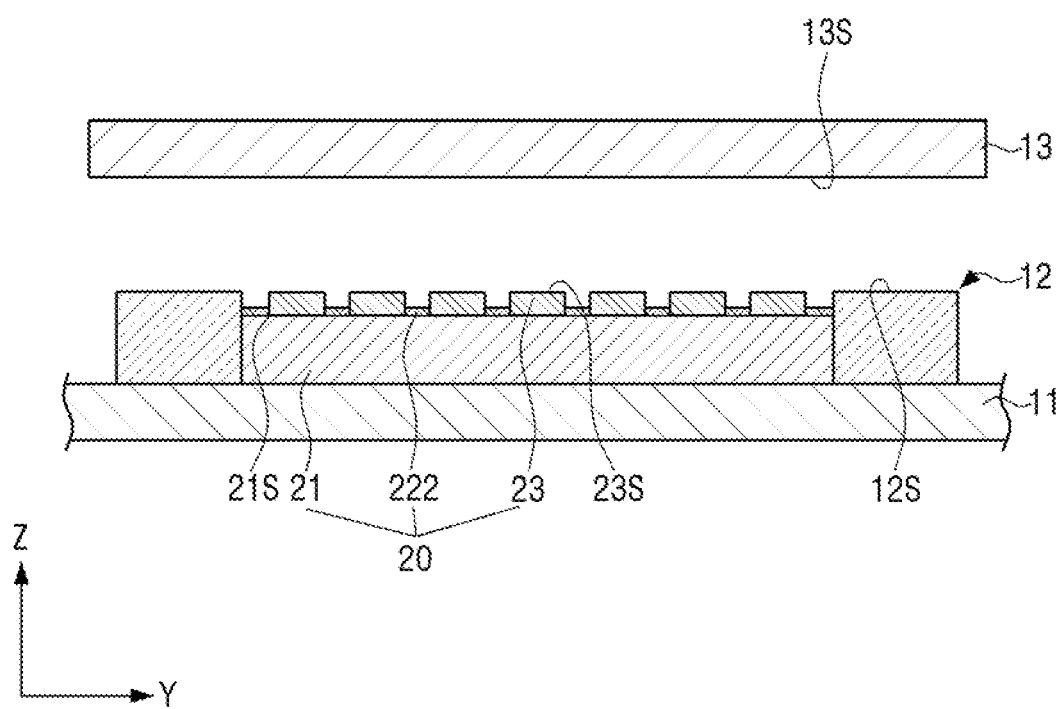

Thereafter, as illustrated in FIG. 6, when the pressing member 13 ascends, the completed light source module 20 in which the plurality of light emitting devices 23 come into contact with the substrate 21 while being fixed to the adhesive layer 222 thus may be released.

As described above, the plurality of light emitting devices 23 may be constituted by the micro LEDs, and the height of the plurality of light emitting devices 23 constituted by the micro LEDs may be, for example, 7 μm. In this case, the height 221H of the adhesive layer 221 is preferably 1 to 2 μm. The plurality of light emitting devices 23 may be pressed by the pressing member 13 to descend by 1 to 2 μm and may come into contact with the substrate 21. In this case, the height of the substrate 21 may be 0.7 mm.

As described above, when the plurality of light emitting devices 23 are constituted by the micro LEDs, the plurality of light emitting devices 23 descend by 1 to 2 μm, which is a very fine size, by the pressing member 13. While the plurality of light emitting devices 23 constituted by such a micro LED are pressed through the pressing member 13, it is possible to accurately maintain the leveling of the pressing member 13 through the support member 12, and as a result, the pressing member 13 can apply a uniform pressure to the plurality of ultra-compact light emitting devices 23. Accordingly, the compression bonding apparatus 10 according to the embodiment of the disclosure can easily manufacture the light source module 20 in which the plurality of light emitting devices 23 are coupled on the correct position of the substrate 21.

FIGS. 7 to 13 are diagrams illustrating the process of manufacturing the light source module 20 by the compression bonding apparatus 10 according to another embodiment of the disclosure.

Hereinafter, the process of manufacturing the light source module 20 by the compression bonding apparatus 10 according to another embodiment of the disclosure will be described with reference to FIGS. 7 to 13.

However, the process of manufacturing the light source module 20 illustrated in FIGS. 7 to 13 is similar to the process of manufacturing the light source module 20 illustrated in FIGS. 3 to 6, and therefore overlapping descriptions thereof will be omitted, and unlike the process of manufacturing the light source module 20 illustrated in FIGS. 3 to 6, there is a difference in that the pressure distribution of the pressing member 13 is previously measured by a pressure sensing sheet 30, which will be mainly described.

Figure 7:
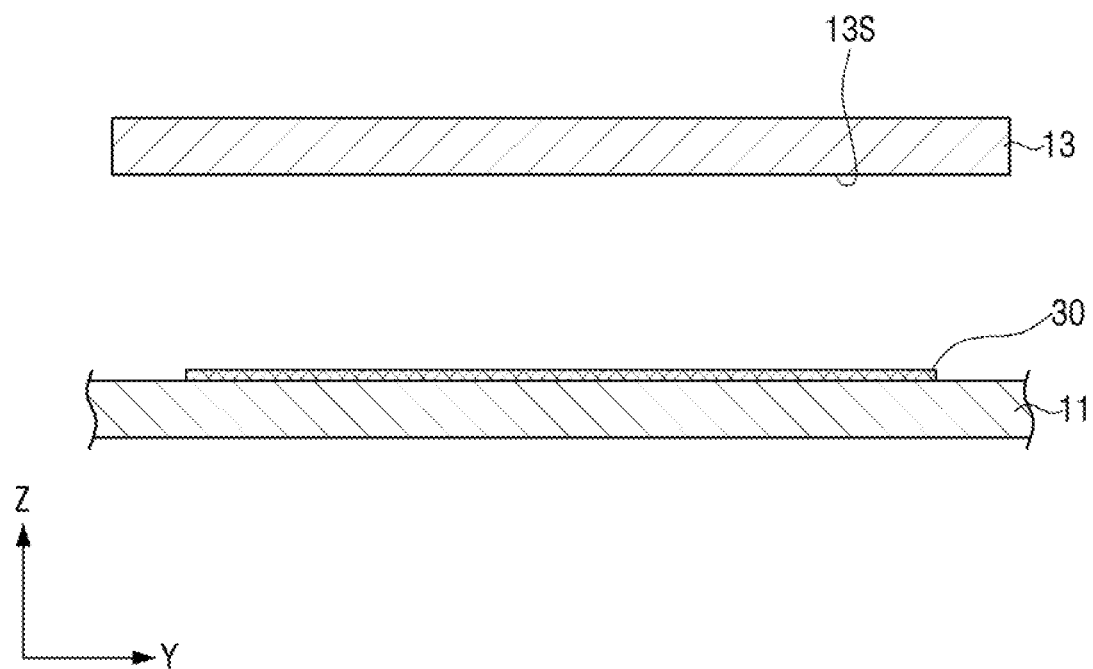
FIGS. 7 to 13 are views illustrating a process of manufacturing a light source module through a compression bonding device according to another embodiment of the disclosure.

First, as illustrated in FIG. 7, the pressure sensing sheet 30 is arranged on the stage 11.

The pressure sensing sheet 30 is a sheet whose color of the surface changes according to the magnitude of the applied pressure when a surface of the pressure sensing sheet 30 is pressed.

The pressure sensing sheet 30 may include a pressure sensing paper whose one surface is applied with ink and an indicator paper on which ink applied to one surface of the pressure sensing paper can be displayed on the surface by pressure.

However, the pressure sensing sheet 30 is the same as in the related art, a detailed description thereof will be omitted.

Figure 8:
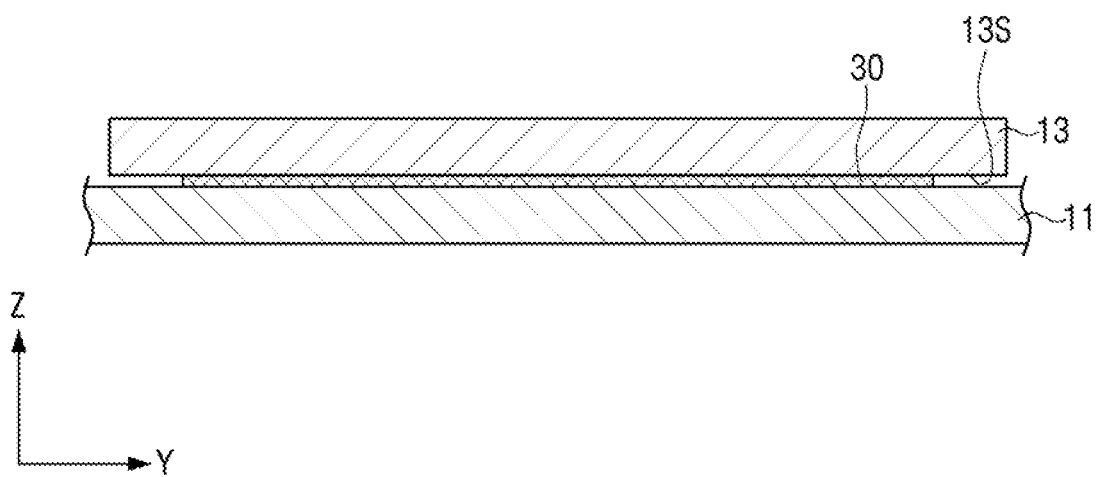

Thereafter, as illustrated in FIG. 8, the pressing member 13 descends to press the pressure sensing sheet 30.

As described above, the pressing member 13 may be inclined or shaken while descending, and as a result, the pressure distribution applied by the pressing member 13 to the stage 1 may not be constant.

As illustrated in FIGS. 9A and 9A, the pressure sensing sheet 301 before the pressing member 13 is pressed is pressed by the pressing member 13, so the pressure distribution of the pressing member 13 can be visually displayed.

The pressing member 13 may have the non-uniform pressure distribution applied to the stage 11 due to reasons such as inclination or shaking while descending, and the non-uniform pressure distribution of the pressing member 13 may be visually confirmed through the pressure sensing sheet 302.

As an example, based on FIG. 9I, when the color on the left side of the pressure sensing sheet 302 pressed by the pressing member 13 is displayed darker than the color on the right side, it may be determined that the pressure distribution applied by the pressing member 13 is relatively higher on the right side of the pressing member 13 than on the left side thereof.

Figure 10:
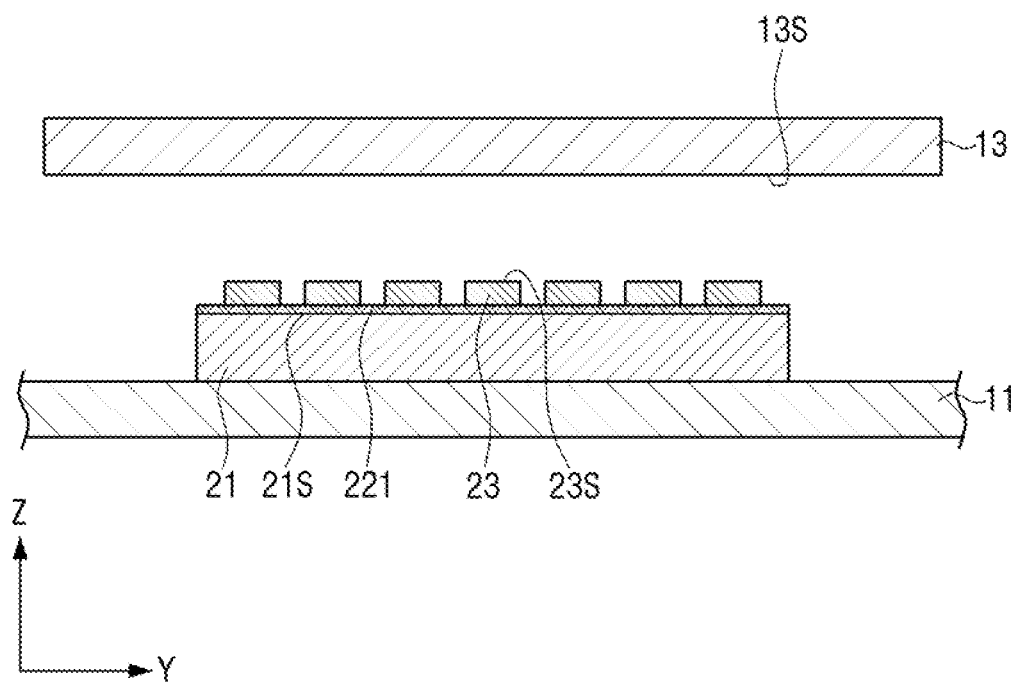

Thereafter, as illustrated in FIG. 10, the substrate 21 on which the plurality of light emitting devices 23 are arranged on the adhesive layer 221 is arranged on the stage 11.

The substrate 21 is arranged on the stage 11 in a state in which the plurality of light emitting devices 23 are temporarily attached on the adhesive layer 221.

Figure 11:
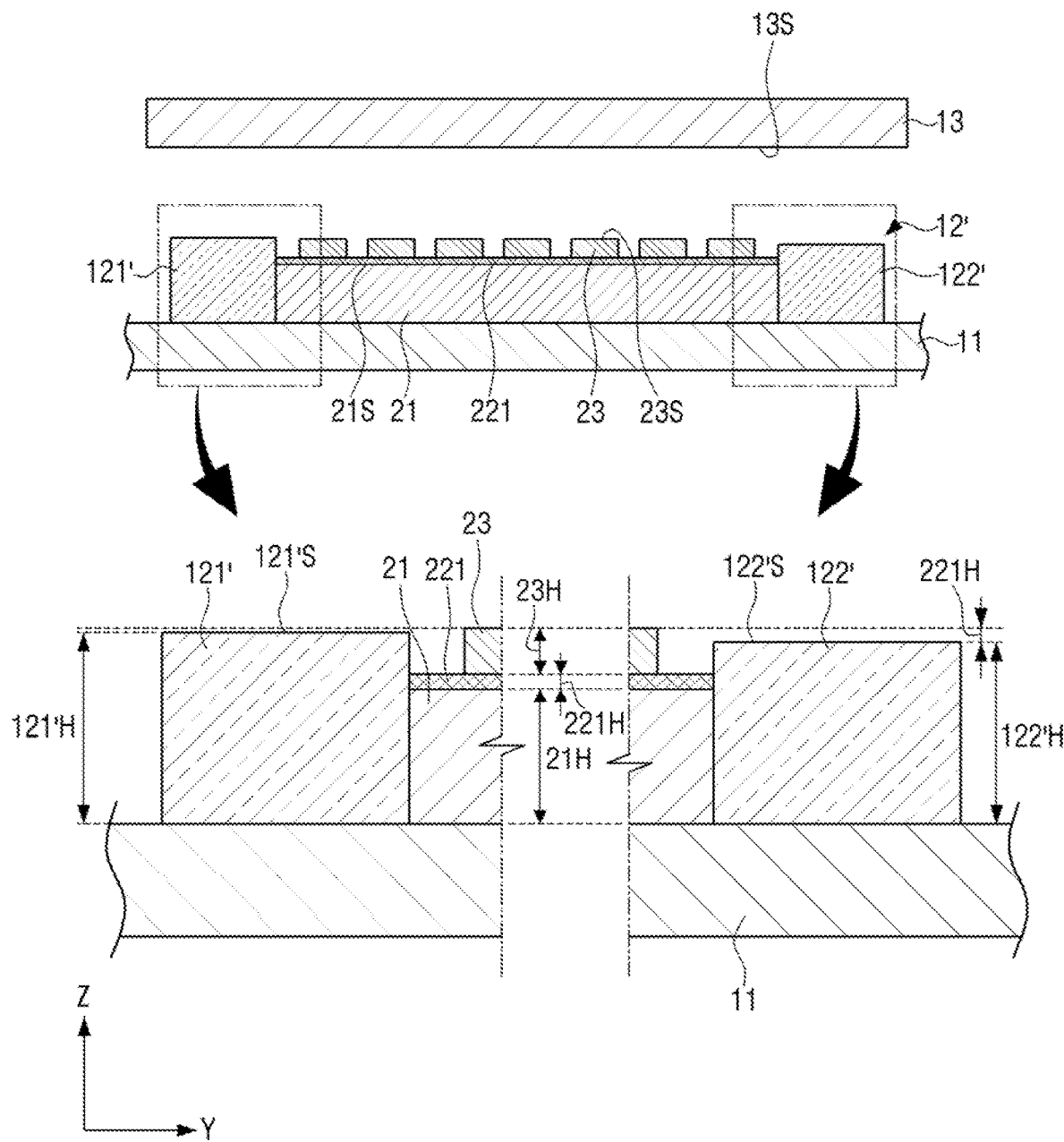
Figure 12:
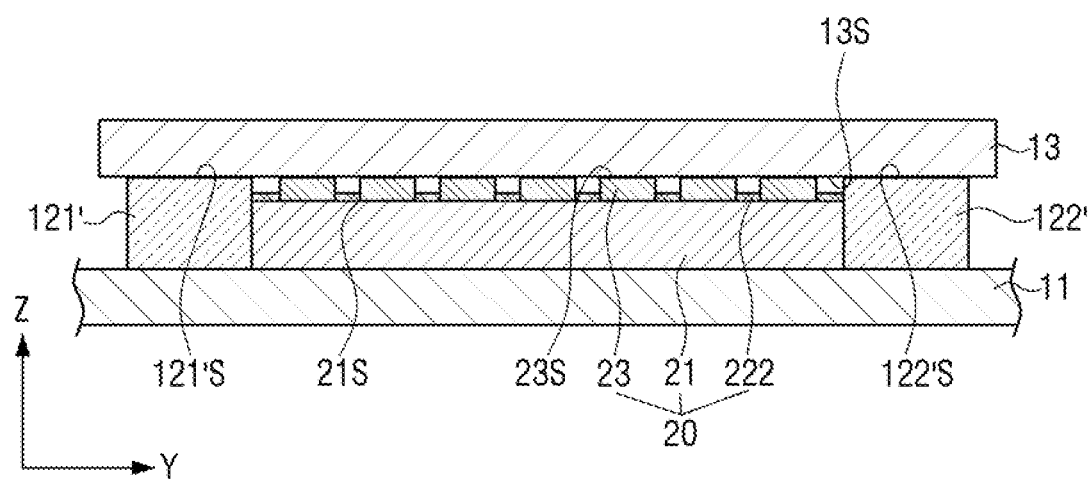

Thereafter, as illustrated in FIGS. 11 and 12 based on the pressure distribution of the pressing member 13 identified through the pressure sensing sheet 30, a support member 12' surrounding at least a part of the side surface portion of the substrate 21 is arranged on the stage 11, and then the pressing member 13 descends to press the plurality of light emitting devices 23 so that the plurality of light emitting devices 23 come into contact with the substrate 21.

The support member 12' is configured so that a height of a part corresponding to a part where the pressure distribution of the pressing member 13 measured by the pressure sensing sheet 30 is relatively higher is greater than heights of other parts corresponding to a part where the pressure distribution is relatively lower.

That is, the height of at least one of the first to fourth support members 121 to 124 may be configured differently according to the distribution of pressure applied by the pressing member 13.

Thereby, by reducing the pressure of the part where the pressure applied from the pressing member 13 is relatively higher, the distribution of pressure applied by the pressing member 13 to the plurality of light emitting devices 23 may be uniformly adjusted.

Figure 9:
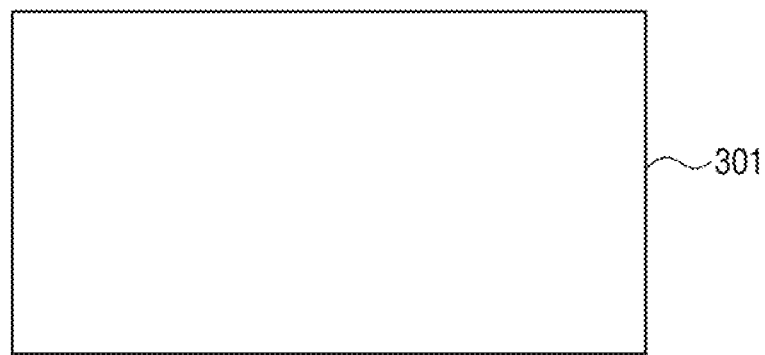
Figure 9:
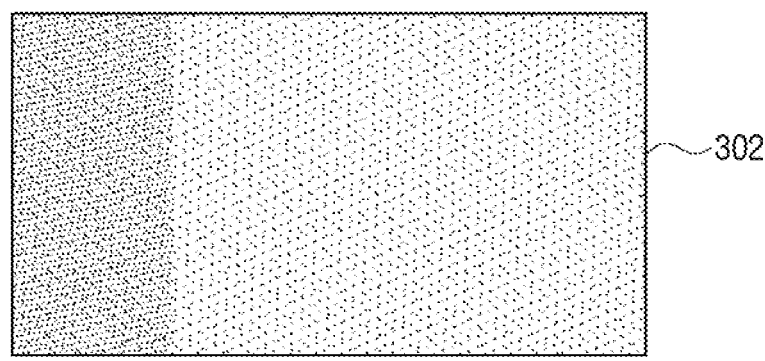

As a specific example, as illustrated in FIG. 9, when the pressure distribution of the pressure applied by the pressing member 13 is measured relatively higher on the left portion of the pressing member 13 than on the right portion thereof, the height of the left portion of the support member 12' is set to be greater than the height of the right portion of the support member 12', thereby compensating for the non-uniform pressure distribution of the pressing member 13.

That is, as illustrated in FIG. 11, by setting a height 121'H of a first support member 121' to be greater than a height 122'H of a second support member 122', the non-uniform pressure distribution of the pressing member 13 applied to the plurality of light emitting devices 23 may be uniformly adjusted.

As a specific example, the height 122'H of the second support member 122' is set to be equal to the sum of the height 12H of the substrate 12 and the height 23H of the plurality of light emitting devices 23, and the height 121'H of the first support member 121' may be set to be greater than the height 122'H of the second support member 122'.

The height 121'H of the first support member 121' is set to be greater than the sum of the height 2111 of the substrate 21 and the height 23H of the light emitting device 23, so the pressed surface 13S of the pressing member 13 descending may be supported ahead of the second support member 122'.

However, the first and second support members 121' and 122' may be integrally configured, and the height of a part of the support member 12' and the heights of other parts may change according to the pressure distribution of the pressing member 13.

Through this, even if the pressure applied from the left portion of the pressing member 13 is greater than the pressure applied from the right portion of the pressing member 13, the first support member 121' first supports the left portion of the pressing member 13 to reduce a relatively larger pressing force of the left portion of the pressing member 13, so the pressing member 13 may uniformly adjust the pressure distribution applied to the plurality of light emitting devices 23.

In addition, the height 121'H of the first support member 121' is preferably configured to be smaller than sum of the height 21H of the substrate 21, the height 221H of the adhesive layer 221, and the height 23H of the plurality of light emitting devices 23 so that the pressing member 13 comes into contact with the upper surface 23S of the plurality of light emitting devices 23 to press the plurality of light emitting devices 23.

In addition, when the plurality of light emitting devices 23 are constituted by the micro LED, the difference between the height 121'H of the first support member 121' and the height 122'H of the second support member 122' is set to be less than several μm, and therefore even if there is the difference between the height 121'H of the first support member 121' and the height 122'H of the second support member 122', the pressing member 13 may simultaneously press the plurality of light emitting devices 23 with a uniform pressure.

Figure 13:
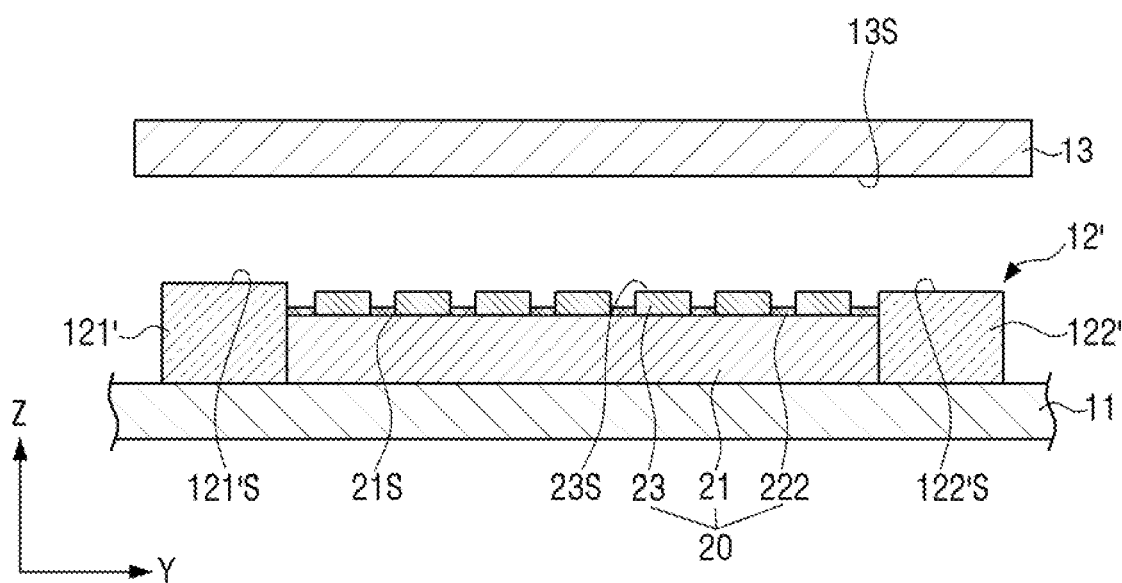

Thereafter, as illustrated in FIG. 13, when the pressing member 13 ascends, the completed light source module 20 in which the plurality of light emitting devices 23 come into contact with the substrate 21 while being fixed to the adhesive layer 222 may be released.

As described above, by measuring the pressure distribution of the pressing member 13 through the pressure sensing sheet 30 in advance, the height of the support member 12 on the side where the pressure applied from the pressing member 13 is relatively higher may be set to be relatively higher than other parts, so the pressure applied to the plurality of light emitting devices 23 may be more uniformly adjusted.

However, the structure of the support member 12' illustrated in FIGS. 7 to 13 is exemplified, and the structure of the support member capable of compensating for the non-uniform pressure distribution of the pressing member 13 may variously change according to the pressure distribution of the pressing member 13 measured by the pressure sensing sheet 30, and the height of the upper surface of the support member may variously change according to the according to the pressure distribution of the pressing member 13.

As described above, in the compression bonding apparatus 10 of the disclosure, the support member 12 arranged on the side surface of the substrate 21 supports the pressing member 13, so the pressure distribution applied by the pressing member 13 to the plurality of light emitting devices 23 may be more uniformly adjusted. Thereby, even if the plurality of light emitting devices 23 are constituted by the ultra-compact light emitting device such as the micro LED, the plurality of light emitting devices may be accurately coupled at the predetermined position of the substrate 21 without changing the arrangement of the plurality of light emitting devices 23 during the compression by the compression bonding apparatus 10, so the light source module 20 having high reliability can be manufactured.

Although the diverse embodiments of the disclosure have been individually described hereinabove, the respective embodiments are not necessarily implemented singly, and may also be implemented so that configurations and operations thereof are combined with those of one or more other embodiments.

Although the embodiments of the disclosure have been illustrated and described hereinabove, the disclosure is not limited to the above-mentioned specific embodiments, but may be variously modified by those skilled in the art to which the disclosure pertains without departing from the scope and spirit of the disclosure as disclosed in the accompanying claims. These modifications should also be understood to fall within the scope of the disclosure.

The invention claimed is:

1. A compression bonding apparatus, comprising:
 a stage configured to support a substrate on which a plurality of light emitting devices are arranged on an adhesive layer having a predetermined viscosity;
 a support member disposed on the stage and surrounding at least a part of a side surface of the substrate; and
 a pressing member configured to press the plurality of light emitting devices,
 wherein the support member has a height equal to or greater than a height of the substrate,
 wherein the plurality of light emitting devices is configured to be fixed to the substrate as the adhesive layer is cured,
 wherein the adhesive layer is made of a thermosetting material, and
 wherein the pressing member is further configured to heat the adhesive layer while pressing the plurality of light emitting devices.

2. The compression bonding apparatus as claimed in claim 1, wherein the pressing member is further configured to descend from upper sides of the plurality of light emitting devices to press the plurality of light emitting devices so that the plurality of light emitting devices come into contact with the substrate.

3. The compression bonding apparatus as claimed in claim 1, wherein the height of the support member is equal to a sum of the height of the substrate and a height of the plurality of light emitting devices.

4. The compression bonding apparatus as claimed in claim 1, wherein the height of the support member is set to be smaller than a sum of the height of the substrate, a height of the adhesive layer, and a height of the plurality of light emitting devices.

5. The compression bonding apparatus as claimed in claim 4, wherein the height of the support member is set to be equal to or greater than a sum of the height of the substrate and the height of the plurality of light emitting devices.

6. The compression bonding apparatus as claimed in claim 5, wherein a height of a part of the support member is set to be different from heights of other parts thereof.

7. The compression bonding apparatus as claimed in claim 1, wherein the support member surrounds an entire side surface portion of the substrate along a circumference of the substrate.

8. The compression bonding apparatus as claimed in claim 7, wherein the substrate has a rectangular shape,
the side surface portion of the substrate includes a first side surface, a second side surface, a third side surface, and a fourth side surface, and
the support member includes a first support member, a second support member, a third support member, and a fourth support member surrounding the first side surface, the second side surface, the third side surface, and the fourth side surface.

9. The compression bonding apparatus as claimed in claim 8, wherein a height of at least one of the first support member, the second support member, the third support member, and the fourth support member is set differently.

10. The compression bonding apparatus as claimed in claim 1, wherein an upper surface of the support member and an upper surface of each of the plurality of light emitting devices are arranged in parallel with a pressing surface of the pressing member.

11. The compression bonding apparatus as claimed in claim 1, wherein at least a part of an upper surface of the support member faces a pressed surface of the pressing member.

12. The compression bonding apparatus as claimed in claim 1, wherein thermal conductivity of the support member is equal to that of the substrate.

13. The compression bonding apparatus as claimed in claim 1, wherein the adhesive layer consists of a non-conductive paste.

14. The compression bonding apparatus as claimed in claim 1, wherein the adhesive layer consists of an anisotropic conductive paste.

15. A method of using a compression bonding apparatus to manufacture a light source module, the method comprising:
forming an adhesive layer having a predetermined viscosity on an upper surface of a substrate;
arranging a plurality of light emitting devices on the adhesive layer;
arranging the substrate on which the plurality of light emitting devices on a stage;
arranging a support member surrounding at least a part of a side surface of the substrate, wherein a height of the support member equal to or greater than a height of the substrate on the stage, and a height of a part of the support member is different from heights of other parts thereof;
pressing the plurality of light emitting devices by a pressing member descending from upper sides of the plurality of light emitting devices; and
curing the adhesive layer so that the plurality of light emitting devices is fixed to the substrate,
wherein the adhesive layer is made of a thermosetting material, and
wherein the pressing member is further configured to heat the adhesive layer while pressing the plurality of light emitting devices.

16. A method of using a compression bonding apparatus to manufacture a light source module, the method comprising:
measuring a pressure distribution applied by a pressing member to a stage by pressing a pressure sensing sheet arranged on the stage by a-the pressing member;
arranging a substrate on which a plurality of light emitting devices are arranged on an adhesive layer having a predetermined viscosity on the stage;
arranging a support member surrounding at least a part of a side surface of the substrate, wherein a height of the support member equal to or greater than a height of the substrate on the stage, and a height of a part of the support member is different from heights of other parts thereof;
pressing the plurality of light emitting devices by the pressing member descending from upper sides of the plurality of light emitting devices; and
curing the adhesive layer so that the plurality of the light emitting devices is fixed to the substrate,
wherein the support member is configured so that a height of a part corresponding to a part where the pressure distribution is measured relatively higher is greater than heights of other parts corresponding to a part where the pressure distribution is measured relatively lower,
wherein the adhesive layer is made of a thermosetting material, and
wherein the pressing member is further configured to heat the adhesive layer while pressing the plurality of light emitting devices.

* * * * *